(12) United States Patent
Wang et al.

(10) Patent No.: US 10,871,839 B2
(45) Date of Patent: Dec. 22, 2020

(54) COLOR FILTER SUBSTRATE, ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Haisheng Wang, Beijing (CN); Xue Dong, Beijing (CN); Hailin Xue, Beijing (CN); Xiaoliang Ding, Beijing (CN); Shengji Yang, Beijing (CN); Yingming Liu, Beijing (CN); Weijie Zhao, Beijing (CN); Hongjuan Liu, Beijing (CN); Changfeng Li, Beijing (CN); Wei Liu, Beijing (CN); Hao Zhang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 264 days.

(21) Appl. No.: 14/903,179

(22) PCT Filed: Jul. 10, 2015

(86) PCT No.: PCT/CN2015/083700
§ 371 (c)(1),
(2) Date: Jan. 6, 2016

(87) PCT Pub. No.: WO2016/115842
PCT Pub. Date: Jul. 28, 2016

(65) Prior Publication Data
US 2016/0370904 A1     Dec. 22, 2016

(30) Foreign Application Priority Data

Jan. 22, 2015   (CN) .......................... 2015 1 0032784

(51) Int. Cl.
*G06F 3/041*       (2006.01)
*G02F 1/1333*      (2006.01)
(Continued)

(52) U.S. Cl.
CPC .......... *G06F 3/0412* (2013.01); *G02F 1/1368* (2013.01); *G02F 1/13338* (2013.01);
(Continued)

(58) Field of Classification Search
CPC .......... G02F 1/13338; G02F 1/133512; G02F 1/133514; G02F 1/1368;
(Continued)

(56) References Cited

U.S. PATENT DOCUMENTS

| 8,946,690 B2 | 2/2015 | Lee et al. |
| 9,069,400 B2 | 6/2015 | Shih |

(Continued)

FOREIGN PATENT DOCUMENTS

| CN | 102662521 A | 9/2012 |
| CN | 102830879 A | 12/2012 |

(Continued)

OTHER PUBLICATIONS

International Search Report of PCT/CN2015/083700 in Chinese, dated Oct. 29, 2015 with English translation.

(Continued)

*Primary Examiner* — LaTanya Bibbins
(74) *Attorney, Agent, or Firm* — Collard & Roe, P.C.

(57) ABSTRACT

A color filter substrate, an array substrate and a display device are disclosed. The display device includes an opposed substrate and an array substrate, or an opposed (Continued)

substrate, an array substrate and a protection substrate located on a side of the opposed substrate that is apart from the array substrate. The display device is divided into a display area and a periphery area, at least one layer of periphery touch electrode is provided in the periphery area, the at least one layer of periphery touch electrode is disposed on at least one of the array substrate, the opposed substrate and the protection substrate. The display device can alleviate the problem of impacting viewing effects due to touch operation on the display area.

14 Claims, 3 Drawing Sheets

(51) Int. Cl.
*G02F 1/1335* (2006.01)
*G02F 1/1368* (2006.01)
*H01L 27/12* (2006.01)
*H04M 1/23* (2006.01)

(52) U.S. Cl.
CPC ...... *G02F 1/133512* (2013.01); *G06F 3/0416* (2013.01); *H01L 27/1255* (2013.01); *G02F 1/133514* (2013.01); *G02F 2001/133388* (2013.01); *G06F 2203/04103* (2013.01); *H04M 1/23* (2013.01); *H04M 2250/22* (2013.01)

(58) Field of Classification Search
CPC ......... G02F 2001/133388; G06F 3/041; G06F 3/0412; G06F 3/0416; H01L 27/1255
See application file for complete search history.

(56) References Cited

U.S. PATENT DOCUMENTS

| | | | |
|---|---|---|---|
| 9,219,086 B2 | 12/2015 | Wang et al. | |
| 2006/0097991 A1* | 5/2006 | Hotelling | G06F 3/0414 345/173 |
| 2009/0096767 A1 | 4/2009 | Liu et al. | |
| 2009/0273573 A1* | 11/2009 | Hotelling | G06F 3/044 345/173 |
| 2010/0123681 A1 | 5/2010 | Wu et al. | |
| 2013/0169567 A1* | 7/2013 | Shih | G06F 3/0412 345/173 |
| 2013/0293790 A1* | 11/2013 | Chang | G02F 1/133514 349/12 |
| 2014/0028616 A1 | 1/2014 | Furutani et al. | |
| 2014/0253498 A1* | 9/2014 | Suzuki | G06F 3/044 345/174 |
| 2014/0366897 A1* | 12/2014 | Liu | A24F 47/008 131/329 |
| 2015/0370114 A1 | 12/2015 | Du et al. | |
| 2016/0098113 A1 | 4/2016 | Ding et al. | |

FOREIGN PATENT DOCUMENTS

| | | |
|---|---|---|
| CN | 102937845 A | 2/2013 |
| CN | 202815769 U | 3/2013 |
| CN | 103049155 A | 4/2013 |
| CN | 203658969 U | 6/2014 |
| CN | 103970392 A | 8/2014 |
| CN | 104062817 A | 9/2014 |
| CN | 104298410 A | 1/2015 |
| CN | 104536197 A | 4/2015 |
| CN | 104598064 A | 5/2015 |
| KR | 10-2013-0063971 A | 6/2013 |
| KR | 10-2015-0002389 A | 1/2015 |

OTHER PUBLICATIONS

Notice of Transmittal of the International Search Report of PCT/CN2015/083700 in Chinese, dated Oct. 29, 2015.
Written Opinion of the International Searching Authority of PCT/CN2015/083700 in Chinese, dated Oct. 29, 2015 with English translation.
Chinese Office Action in Chinese Application No. 201510032784.0, dated Jan. 3, 2017 with English translation.
Second Chinese Office Action in Chinese Application No. 201510032784.0, dated Jul. 11, 2017 with English translation.
Third Chinese Office Action in Chinese Application No. 201510032784.0, dated Nov. 13, 2017 with English translation.
European Search Report in European Application No. 15832782.5 dated Jul. 9, 2018.
English translation of European Office Action in EP Application No. 15832782.5 dated Jul. 22, 2020.

* cited by examiner

US 10,871,839 B2

COLOR FILTER SUBSTRATE, ARRAY SUBSTRATE AND DISPLAY DEVICE

CROSS REFERENCE TO RELATED APPLICATIONS

This application is the National Stage of PCT/CN2015/083700 filed on Jul. 10, 2015, which claims priority under 35 U.S.C. § 119 of Chinese Application No. 201510032784.0 filed on Jan. 22, 2015, the disclosure of which is incorporated by reference.

TECHNICAL FIELD

At least one embodiment of the present invention relates to a color filter substrate, an array substrate and a display device.

BACKGROUND

With the rapid development of display technology, touch display devices have been gradually used in people's life widely. Touch display devices may be classified into add-on touch display devices, on-cell touch display devices, and in-cell touch display devices according to their constituting structures.

For an add-on touch display device, a touch structure and a protection substrate outside a liquid crystal panel are integrated together to form a single touch panel, and a liquid crystal display device with touch function is formed by producing a touch panel and a liquid crystal panel separately and then attaching them together.

An on-cell touch display device and an in-cell touch display device are both formed by integrating a touch structure and a liquid crystal panel with the difference being in that, for the on-cell touch display device, the touch structure is formed on a surface of the opposed substrate (such as a color filter substrate) in the liquid crystal panel, which surface is apart from the array substrate, while for the in-cell touch display device, the touch structure is disposed inside the liquid crystal panel, for example, on the side of the opposed substrate in the liquid crystal panel, which surface face the array substrate, and/or the touch structure is disposed on the array substrate.

SUMMARY

At least one embodiment of the present invention provides a color filter substrate, an array substrate and a display device, to alleviate the problem of impacting viewing effect by carrying out a touch operation only on the display area.

At least one embodiment of the present invention provides a color filter substrate including a substrate and a color filter layer thereon, and the substrate comprises a display area and a periphery area, and at least one layer of periphery touch electrode is disposed in the periphery area.

At least one embodiment of the present invention provides an array substrate including a base substrate and a plurality of pixel units arranged in a matrix on the base substrate, and the base substrate comprises a display area and a periphery area, and at least one layer of periphery touch electrode is disposed in the periphery area.

At least one embodiment of the present invention further provides a display device including an array substrate, or including an opposed substrate and an array substrate, or including an opposed substrate, an array substrate and a protection substrate located on a side of the opposed substrate that is apart from the array substrate; the display device is divided into a display area and a periphery area, at least one layer of periphery touch electrode is provided in the periphery area, the at least one layer of periphery touch electrode is disposed on at least one of the array substrate, the opposed substrate or the protection substrate.

At least one embodiment of the present invention further provides a display device including the above-mentioned color filter substrate or the above-mentioned array substrate.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. All other embodiments obtained by those skilled in the art without any creative labor based on the described embodiments of the present invention belong to the protection scope of the present invention.

Unless otherwise defined, all the technical or scientific terms used in the present disclosure have the same meanings as commonly understood by one of ordinary skill in the art to which the present invention belongs. The terms "first," "second," etc., which are used in the present disclosure are not intended to indicate any sequence, amount or importance, but distinguish various different components. Also, the terms such as "a", "an", or "the" etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On", "under", "right", "left" and the like are only used to indicate relative position relationship, and when the position of the object which is described is changed, the relative position relation relationship may be changed accordingly.

Figure 1:
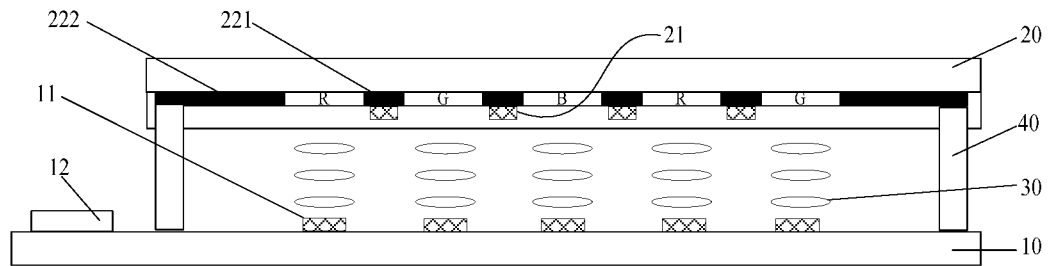
FIG. 1 is a cross-sectional structure diagram of an in-cell touch display device.

An in-cell touch display devices can reduce the overall thickness of module and can drastically reduce manufacturing costs because the touch structures are disposed inside the liquid crystal panel, and therefore become attractive to panel manufacturers. FIG. 1 is a cross-sectional diagram of an in-cell touch display device. The touch display device includes an array substrate 10 and an opposed substrate 20 disposed oppositely with a liquid crystal layer 30 being disposed therebetween and bonded together with e.g., sealant 40 to form a liquid crystal cell. The opposed substrate 20 is generally a color filter substrate on which a color filter layer including red sub-pixels R, green sub-pixels G and blue sub-pixels B may be disposed. Sub-pixels are separated by a black matrix 221 in the display area and the color filter layer is surrounded by a periphery black matrix 222 disposed in periphery region. A plurality of touch sensing electrodes 21 are disposed on the color filter layer and the black matrix. A plurality of touch driving electrodes 11 and a touch chip 12 are disposed on the array substrate 10. Touch sensing electrodes 21 and touch driving electrodes 11 are connected with the touch chip 12 respectively via wires. The touch chip 12 can determine touch positions by detecting the variation of capacitance between touch sensing electrodes 21 and the touch driving electrodes 11.

The inventors of the present application in study have noted that in a conventional touch display device, the touch structure is disposed in the display area of screen, while the periphery sides of the screen (for example, regions corresponding to the periphery black matrix 222 as shown in FIG. 1) are not effectively utilized, which causes space wasting of the display panel. Furthermore, when a user performs simple operations such as page turning and page zooming while viewing pictures, the user still needs to touch the display area of the screen with a finger (or a touch pen), which causes light to be blocked by the finger while touching the screen or contaminant on the finger to be left on the screen, thereby influencing user's viewing effect. In addition, an in-cell touch display device is generally driven in a time-division manner. For example, in the touch display device as shown in FIG. 1, during the driving process, the period of time for displaying a frame of picture is divided into a display interval, during which touch driving electrodes 11 may be suspended while touch sensing electrodes 21 may be normally input with common electrode signals, and a touch interval, during which touch driving electrodes 11 are applied with touch driving voltage signals. In the display intervals, touch driving electrodes 11 do not work because they are limited by the time-division driving, which restricts the processing speed of touch operations.

An embodiment of the present invention provides a color filter substrate, an array substrate and a display device. The display device includes an opposed substrate and an array substrate, or includes an opposed substrate, an array substrate and a protection substrate provided on a side of the opposed substrate apart from the array substrate. The display device is divided into a display area and a periphery area. At least one layer of periphery touch electrode is disposed in the periphery area, which is disposed on at least one of the array substrate, the opposed substrate or the protection substrate. By disposing periphery touch electrodes in the periphery area, the embodiment of the present invention can implement for example some simple touch operations such as page zooming, turning page up, down, left or right, returning to previous page, returning to homepage, and calling out a menu, thereby mitigating the problem of impacting viewing effect by carrying out touch operation only in the display area and taking full advantage of the space in the periphery area. Furthermore, in the embodiment of the present invention, it is possible to configure the periphery touch electrodes to normally function in the display intervals while time-division is applied to drive touch electrodes of the display area, thereby improving processing speed of touch operations for time-division driving.

Figure 2A:
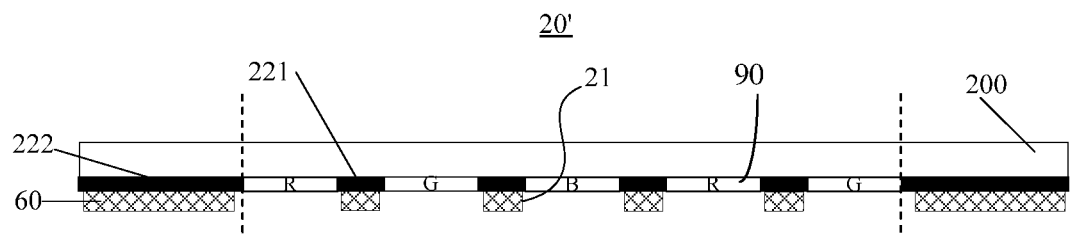
FIG. 2a is a cross-sectional structure diagram of a color filter substrate provided in an embodiment of the present invention.
Figure 2B:
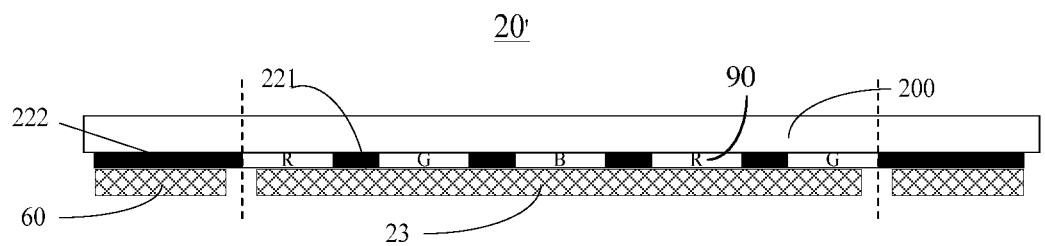
FIG. 2b is a cross-sectional structure diagram of another color filter substrate provided in an embodiment of the present invention.
Figure 2C:
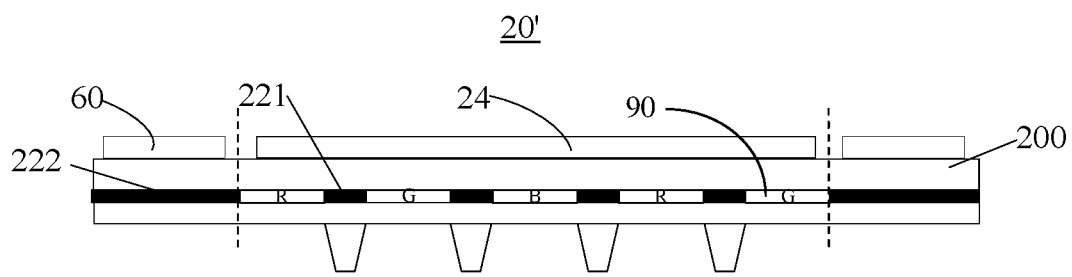
FIG. 2c is a cross-sectional structure diagram of yet another color filter substrate provided in an embodiment of the present invention.

At least one embodiment of the present invention provides a color filter substrate. As shown in FIGS. 2a to 2c, the color filter substrate 20' includes a substrate 200, such as a glass substrate or a quartz substrate, and a color filter layer 90 thereon (the layer in which red sub-pixels R, green sub-pixels G and blue sub-pixels B are located). The substrate 200 includes a display area (the area for displaying pictures between the two dashed lines in the figure) and a periphery area in which at least one layer of periphery touch electrode 60 is disposed.

It is to be noted that the periphery touch electrode 60 may be disposed in at least one periphery area outside the display area. Periphery touch electrodes 60 can implement touch operation in accordance with self-capacitance or mutual capacitance principle. Therefore, the periphery touch electrodes 60 disposed on the color filter substrate may be of at least one layer. For example, while the self-capacitance principle is utilized, the periphery touch electrodes 60 may be in one layer. For example, when the mutual capacitance principle is utilized, the periphery touch electrodes 60 may be in two layers, one of which is touch driving electrodes, and the other is touch sensing electrodes; alternatively, the periphery touch electrodes 60 may also be in one layer. For example, it is possible to dispose a layer of touch sensing electrode in the periphery area of the color filter substrate 20' and dispose a layer of touch driving electrode correspondingly in the periphery area of the array substrate. In addition, according to practical demands and spatial factors, at least one periphery touch electrodes may be disposed in the layer of periphery touch electrode.

In the color filter substrate 20', in order to prevent light leakage, improve display contrast ratio, prevent color mixing, and increase color purity, a display area black matrix 221 is generally disposed among sub-pixels in the display area; and in order to prevent light leakage in periphery area, a periphery black matrix 222 is disposed in the periphery area. In at least one embodiment, the periphery black matrix 222 may be located between periphery touch electrodes 60 and the substrate 200, or the periphery black matrix 222 and the periphery touch electrodes 60 may be located on different sides of the substrate 200 (namely a side of the substrate 200 that faces the color filter layer 90 and a side apart from the color filter layer 90). The following embodiments will be described with respect to the periphery black matrix 222 located between periphery touch electrodes 60 and the substrate 200 as an example.

It is also possible to dispose at least a layer of conductive structure in the display area of the color filter substrate 20' in addition to insulating layers such as the color filter layer and the black matrix layer. In this case, in order to save process steps, it is possible to form at least one layer of periphery touch electrode 60 in the periphery area at the same time as manufacturing the at least one layer of conductive structure in the display area.

For example, when a layer of conductive structure is disposed in the display area, a layer of periphery touch electrode may be disposed in the periphery area. In this case, the periphery touch electrodes and the conductive structure may be disposed in the same layer, and thus can be formed in the same patterning process (for example, including steps of exposure, development, etching, or the patterning process may be another process for forming preset patterns).

For example, when at least two layers of conductive structures are disposed in the display area, a layer of periphery touch electrode 60 may be disposed in the periphery area which may be disposed in the same layer as any one of the at least two layers of conductive structures so as to be formed in the same patterning process. Alternatively, it is also possible to dispose two layers of periphery touch electrodes 60 in the periphery area; for example, one layer includes touch driving electrodes and the other includes touch sensing electrodes. The touch driving electrodes and touch sensing electrodes may be disposed in the same layer as any two layers of the at least two layers of conductive structures. Therefore, these two layers of touch electrodes and these two layers of conductive structures may be formed in at most two patterning processes.

In at least one embodiment, at least one layer of display area touch electrode may be disposed in the display area of the color filter substrate. The display area touch electrodes may be located on a side of the color filter substrate where the color filter layer is located (for example, when the color filter substrate is applied for an in-cell touch display device) or on a side that is apart from the color filter layer (for example, when the color filter substrate is applied for an on-cell touch display device). The number of the layer(s) of display area touch electrode and the number of the layer(s) of periphery area touch electrode may be equal to each other or different from each other, that is, both of them may utilize self-capacitance principle or mutual capacitance principle, or one of them utilizes self-capacitance principle while the other utilizes mutual capacitance principle. FIG. 2a shows a color filter substrate in which both touch electrodes and periphery touch electrodes are in one layer. As shown in FIG. 2a, the periphery touch electrodes 60 may be disposed in the same layer as touch electrodes 21.

The color filter substrate 20' provided in embodiments of the present invention is applicable to various kinds of display devices such as liquid crystal display devices and OLED (organic light emitting diode) display devices. The following embodiments will be described with respect to a liquid crystal display device as an example and with respect to an example in which a layer of periphery touch electrode 60 is disposed in the periphery area of the color filter substrate 20'.

A liquid crystal display device generally includes an array substrate and a color filter substrate disposed oppositely and controls light by driving rotation of liquid crystal with an electric field formed between pixel electrodes and common electrodes. According to the type of driving electric field, for example, liquid crystal display devices can be classified into vertical electric field liquid crystal display devices and horizontal electric field liquid crystal display devices.

In a vertical electric field liquid crystal display device, pixel electrodes and common electrodes are located on the array substrate and the color filter substrate respectively. FIG. 2b shows a color filter substrate that may be applied to vertical electric field liquid crystal display device. As shown in FIG. 2b, the periphery touch electrodes 60 in the periphery area and the common electrodes 23 in the display area may be disposed in the same layer.

In a horizontal electric field liquid crystal display device, pixel electrodes and common electrodes are both located on the array substrate. In this case, a transparent conductive layer may be disposed on a side of the color filter substrate that is apart from the color filter layer to shield external interference. FIG. 2c shows a color filter substrate disposed with a transparent conductive layer. As shown in FIG. 2c, the periphery touch electrodes 60 may be disposed in the same layer as the transparent conductive layer 24.

It is to be noted that FIGS. 2a, 2b and 2c are described with respect to only an example in which the at least one layer of conductive structure on the color filter substrate are respectively a layer of display area touch electrode 21, common electrodes 23 and transparent conductive layer 24. However, the at least one layer of conductive structure in the display area of color filter substrate may include at least one of at least one layer of display area touch electrode, common electrodes, and a transparent conductive layer on a side of the substrate that is apart from the color filter layer. Of course, when no conductive structure is disposed in the display area on the color filter substrate, it is also possible to form periphery touch electrodes with one single patterning process.

In the above-mentioned embodiments, the display area touch electrodes, common electrodes and transparent conductive layer may be all made of a transparent conductive material such as metal oxides, e.g., indium tin oxide, indium zinc oxide, or the like. Therefore, the periphery touch electrodes 60 may also be formed of any of these transparent conductive materials. Of course, the periphery touch electrodes 60 may also be made of a metal material.

In addition, for example, it is also possible to dispose a planarization layer covering the color filter layer and the black matrix on the color filter substrate, on which spacers (as shown in FIG. 2c) may be further provided.

Figure 3:
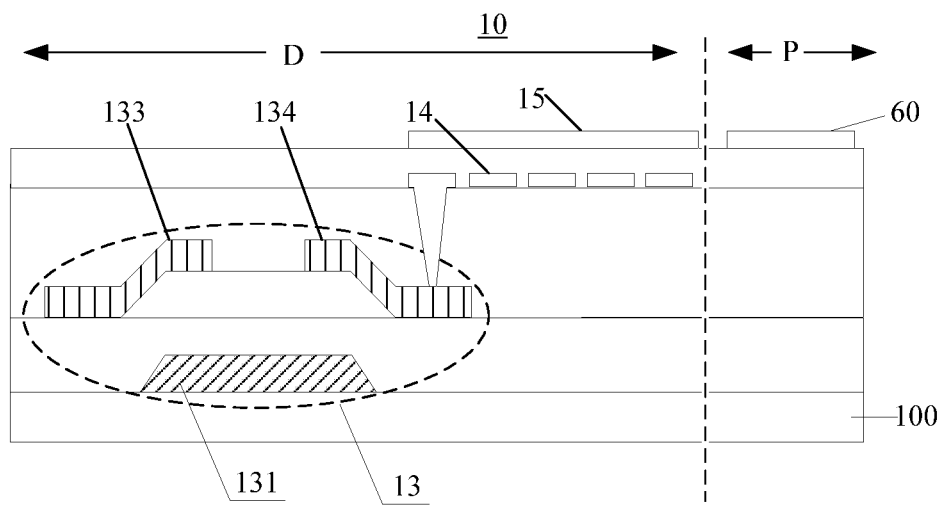
FIG. 3 is a cross-sectional structure diagram of an array substrate provided in an embodiment of the present invention.

At least one embodiment of the present invention further provides an array substrate 10 as shown in FIG. 3, including a base substrate 100 (e.g., glass substrate, quartz substrate, plastic substrate) and a plurality of pixel units arranged in an array on the base substrate 100. The base substrate 100 includes a display area D and a periphery area P in which at least one layer of periphery touch electrode 60 are disposed.

It should be noted that the periphery touch electrodes 60 may be disposed in at least one periphery areas outside the display area. Periphery touch electrodes 60 may implement some simple touch operation in accordance with self-capacitance or mutual capacitance principle. Therefore, the periphery touch electrodes 60 disposed on the color filter substrate may be in at least one layer. For example, while the self-capacitance principle is utilized, the periphery touch electrodes 60 may be in one layer. For example, when mutual capacitance principle is utilized, the periphery touch electrodes 60 may be in two layers, one of which is touch driving electrodes, and the other is touch sensing electrodes. Alternatively, the periphery touch electrodes 60 may also be in one layer; for example, it is possible to dispose a layer of touch sensing electrodes in the periphery area of the color filter substrate and dispose a layer of touch driving electrodes correspondingly in the periphery area of the array substrate. In addition, according to practical demands and spatial factors, at least one periphery touch electrodes may be disposed in the layer of periphery touch electrode.

A plurality of layers of conductive structure are generally disposed in the display area of the array substrate. In order to save process steps, in at least one embodiment, the above-mentioned at least one layer of periphery touch electrode may be disposed in the same layer as at least one layer of the plurality of layers of conductive structure. In this way, the above-mentioned at least one layer of periphery touch electrode may be formed in the same patterning process (e.g., including steps of exposure, development, etching and so on, or the patterning process may be other process for forming a preset pattern) as at least one layer of the plurality of layers of conductive structure.

For example, for an array substrate applied in a liquid crystal display device or an OLED (organic light emitting diode) display device, each pixel unit may include a thin film transistor including a gate electrode, a source electrode, and a drain electrode. Therefore, the above-mentioned plurality of layers of conductive structure may include gate electrodes, source electrodes, and drain electrodes, that is, the above-mentioned at least one layer of periphery touch electrode may be disposed in the same layer as at least one of the gate electrodes, the source electrodes, and the drain electrodes.

For example, each display unit in the array substrate includes a thin film transistor. Based on this configuration, the display area of the array substrate may further include at least one layer of display area touch electrode. Therefore, the above-mentioned conductive structures may include gate electrodes, source electrodes, and drain electrodes and the at least one layer of display area touch electrode, that is, the above-mentioned at least one layer of periphery touch electrode may be disposed in the same layer as the at least one layer of display area touch electrode. It is to be noted that the number of the layers of display area touch electrodes and the number of the layers of periphery area touch electrodes may be the same or different, that is, they may both utilize self-capacitance principle or mutual capacitance principle, or one of them utilizes self-capacitance principle while the other utilizes mutual capacitance principle.

For example, for a vertical electric field (e.g., vertical aligning (VA), twisted nematic (TN)) liquid crystal display device, each pixel unit in the array substrate includes a thin film transistor and a pixel electrode. That is, the above-mentioned plurality of layers of conductive structure may include gate electrodes, source electrodes, drain electrodes, and pixel electrodes. That is, the above-mentioned at least one layer of periphery touch electrode may be disposed in the same layer as at least one of gate electrodes, source electrodes, drain electrodes, and pixel electrodes.

For example, for a horizontal electric field (e.g., in plane switching (IPS), ADvanced Super Dimension Switch (ADS)) liquid crystal display device, each pixel unit in the array substrate includes a thin film transistor, a pixel electrode and a common electrode. In this case, the above-mentioned plurality of layers of conductive structure may include gate electrodes, source electrodes, drain electrodes, pixel electrodes and common electrodes. That is, the above-mentioned at least one layer of periphery touch electrode may be disposed in the same layer as at least one of gate electrodes, source electrodes, drain electrodes, pixel electrodes and common electrodes.

FIG. 3 shows an array substrate of a horizontal electric field liquid crystal display device, including thin film transistors 13, pixel electrodes 14 and common electrodes 15. A thin film transistor 13 includes a gate electrode 131, a source electrode 133 and a drain electrode 134, and a pixel electrode 14 is connected with the drain electrode 134. FIG. 3 shows a layer of periphery touch electrode 60 disposed in the same layer as the common electrodes 15. Of course, the periphery touch electrode 60 may also be disposed in the same layer as any one of the gate electrode 131, the source electrode 133, the drain electrode 134, and the pixel electrode 14. Of course, the embodiment of the present invention includes, but not limited to, the one configuration as shown in FIG. 3. For example, the gate electrode 131 of the thin film transistor 13 may also be located above the source electrode 133 and the drain electrode 134. For example, the common electrode 15 may also be located under the pixel electrode 14.

In the above-mentioned embodiment, the gate electrode, the source electrode, the drain electrode are generally made of a metal material such as copper, aluminum, and chromium, and the display area touch electrode, the pixel electrode and the common electrode are generally made of a transparent conductive material such as indium zinc oxide, indium tin oxide or the like. Therefore, the above-mentioned at least one layer of periphery touch electrode may also be made of a metal material or a transparent conductive material.

At least one embodiment of the present invention further provides a display device including the color filter substrate described in any of the above-mentioned embodiments or the array substrate described in any of the above-mentioned embodiments.

Figure 4A:
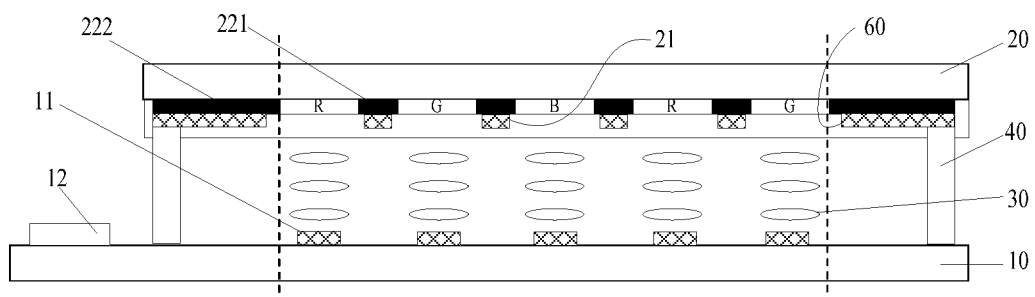
FIG. 4a is a cross-sectional structure diagram of a display device provided in an embodiment of the present invention.
Figure 4B:
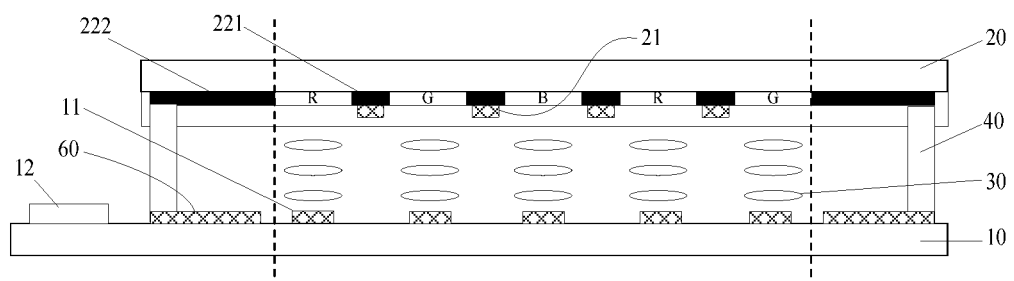
FIG. 4b is a cross-sectional structure diagram of another display device provided in an embodiment of the present invention.
Figure 4C:
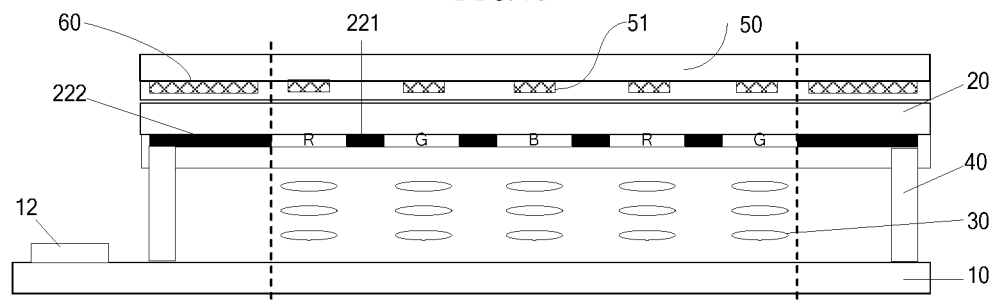
FIG. 4c is a cross-sectional structure diagram of yet another display device provided in an embodiment of the present invention.

In addition, at least one embodiment of the present invention further provides a display device that may include an array substrate 10 as shown in FIGS. 4a and 4b (such as the OLED array substrate covered by the protection layer), or an opposed substrate 20 and an array substrate 10. Alternatively, the display device may include an opposed substrate 20, an array substrate 10, and a protection substrate 50 (such as a glass substrate) located on a side of the opposed substrate 20 that is apart from the array substrate 10 as shown in FIG. 4c. The display device is divided into a display area (the area for displaying pictures between the two dashed lines in the figure) and a periphery area in which at least one layer of periphery touch electrode 60 is disposed, and at least one layer of periphery touch electrode 60 may be disposed on at least one of the array substrate 10, the opposed substrate 20 and the protection substrate 50.

It is to be noted that, FIGS. 4a to 4c are all described with respect to an example in which one layer of periphery touch electrode 60 is disposed in the periphery area. However, embodiments of the present invention are not limited thereto. For example, in the case shown in FIGS. 4a and 4b, it is also possible to dispose touch sensing electrodes in the periphery area of the opposed substrate 20 and dispose corresponding touch driving electrodes in the periphery area of the array substrate 10. In such a case, the two layers of periphery touch electrodes 60 of the display device are disposed on the array substrate 10 and the opposed substrate 20 respectively, and periphery touch electrodes 60 may be disposed in both the periphery area of array substrate 10 and the periphery area of opposed substrate 20. In addition, the periphery touch electrodes 60 may be disposed in at least one periphery area outside the display area.

FIGS. 4a to 4c are all described with reference to an opposed substrate 20, which is a color filter substrate, as an example, that is, a color filter layer including red sub-pixels R, green sub-pixels G and blue sub-pixels B and a display area black matrix 221 disposed among the sub-pixels are disposed on the opposed substrate 20. However, in an embodiment of the present invention, the opposed substrate 20 may also be a transparent substrate, that is, the color filter layer and the display area black matrix are not provided on the substrate, in which case, the color filter layer and the display area black matrix may be disposed on the array substrate for example instead. The embodiment of the present invention will not be described any more.

In addition, in order to describe embodiments of the present invention more clearly, FIGS. 4a to 4c only show a partial structure of the display device and do not show structures such as spacers interposed between the array substrate 10 and the opposed substrate 20.

In at least one embodiment, a periphery black matrix 222 may be further disposed in the periphery area, and the periphery black matrix 222 may be located on the opposed substrate 20 or the array substrate 10.

The display device provided in any embodiment of the present invention may be any product or part with display function such as a liquid crystal panel, electronic paper, an OLED panel, a cell-phone, a tablet, a TV set, a display, a notebook computer, a digital picture frame, a navigator and so on. The following embodiments will be described with respect to a liquid crystal display device as an example.

In at least one embodiment, a plurality of layers of conductive structure may be disposed in the display area of a display device. The above-mentioned at least one layer of periphery touch electrode may be disposed in the same layer as at least one layer of the plurality of layers of conductive structure. Thus, it is possible to form the at least one layer of periphery touch electrode while forming at least one layer of the plurality of layers of conductive structure in the display area with one single patterning process (e.g., including steps of exposure, development, etching and so on, or the patterning process is another process for forming a preset pattern).

For example, the above-mentioned plurality of layers of conductive structure may include at least one layer of display area touch electrode, that is, at least one layer of display area touch electrode is disposed in the display area of the array substrate which may be located on at least one of the array substrate, the opposed substrate, and the protection substrate. In such a case, the above-mentioned at least one layer of periphery touch electrode may be disposed in the same layer as the at least one layer of display area touch electrode.

It is to be noted that the number of layers for display area touch electrodes and periphery touch electrodes may be the same or different, that is, both of them may utilize self-capacitance principle or mutual capacitance principle, or one of them utilizes self-capacitance principle while the other utilizes mutual capacitance principle.

FIGS. 4a and 4b show one layer of periphery touch electrode and two layers of display area touch electrodes, and these two layers of display area touch electrodes are located on the array substrate and the opposed substrate respectively. As shown in FIGS. 4a and 4b, the display device includes an array substrate 10 and an opposed substrate 20 disposed oppositely; the opposed substrate 20 is provided with touch sensing electrodes 21 in a display area; and the array substrate 10 is provided with touch sensing electrodes 11 in a display area. In FIG. 4a, periphery touch electrodes 60 are disposed on the opposed substrate 20 and may be disposed in the same layer as the touch sensing electrodes 21. In FIG. 4b, periphery touch electrodes 60 are disposed on the array substrate 10 and in the same layer as the touch driving electrodes 11.

FIG. 4c shows a layer of periphery touch electrode and a layer of display area touch electrode, and the display area touch electrodes are located on the protection substrate. As shown in FIG. 4c, the display device includes an array substrate 10, an opposed substrate 20, and a protection substrate 50 on a side of the opposed substrate 20 that is apart from the array substrate 10. The protection substrate 50 may be bonded with the opposed substrate 20 together with adhesive glue and provided with display area touch electrodes 51 in a display area and periphery touch electrodes 60 in a periphery area. The display area touch electrodes 51 and the periphery touch electrodes 60 may be disposed in the same layer.

FIGS. 4a and 4b show display area touch electrodes that are located on the array substrate 10 and the opposed substrate 20, and FIG. 4c shows the display area touch electrodes that are located on the protection substrate. Of course, the display area touch electrodes may also be disposed on the array substrate 10 or the opposed substrate 20. In addition, the display area touch electrodes can not only be disposed inside the liquid crystal panel (namely in-cell type) and on the protection substrate (namely one add-on type), but also can be disposed on a surface of the array substrate that is apart from the opposed substrate (namely on-cell type). This will not be described any more here.

In at least one embodiment, the above-mentioned plurality of layers of conductive structure may also be other conductive structures on the array substrate 10 and/or the opposed substrate 20, that is, at least one layer of these conductive structures may be disposed in the same layer as the above-mentioned at least one layer of periphery touch electrode.

For example, the array substrate is provided with thin film transistors including gate electrodes, source electrodes, and drain electrodes. Alternatively, the array substrate may be provided with thin film transistors including gate electrodes, source electrodes, and drain electrodes, and pixel electrodes electrically connected with drain electrodes; and the opposed substrate is provided with common electrodes thereon. Alternatively, the array substrate may be provided with thin film transistors including gate electrodes, source electrodes and drain electrodes, pixel electrodes electrically connected with drain electrodes and common electrodes; the opposed substrate is a transparent substrate or provided with a transparent electrode layer on a side of the opposed substrate that is apart from the array substrate. In these cases, the above-mentioned at least one layer of the plurality of layers of conductive structure may include at least one of gate electrodes, source electrodes, drain electrodes, pixel electrodes, common electrodes, and a transparent electrode layer. With respect to the configuration of structures such as gate electrodes, source electrodes, drain electrodes, pixel electrodes, common electrodes, and the transparent conductive layer, the above-mentioned embodiments about array substrate and color filter substrate can be referred to, and redundant description will not be given here.

As shown in FIGS. 4a to 4c, the display device provided in at least one embodiment of the present invention may further include a touch chip 12. The plurality of periphery touch electrodes 60 provided in the display device may be connected to the same touch chip 12 via wires or connected to different touch chips 12. When the display device further includes display area touch electrodes, the display area touch electrodes and the periphery touch electrodes may be connected to the same touch chip 12 or may be connected to different touch chips.

The working process for implementing set touch functions with periphery touch electrodes will be described in detail below with reference to FIGS. 5 and 6.

Figure 5:
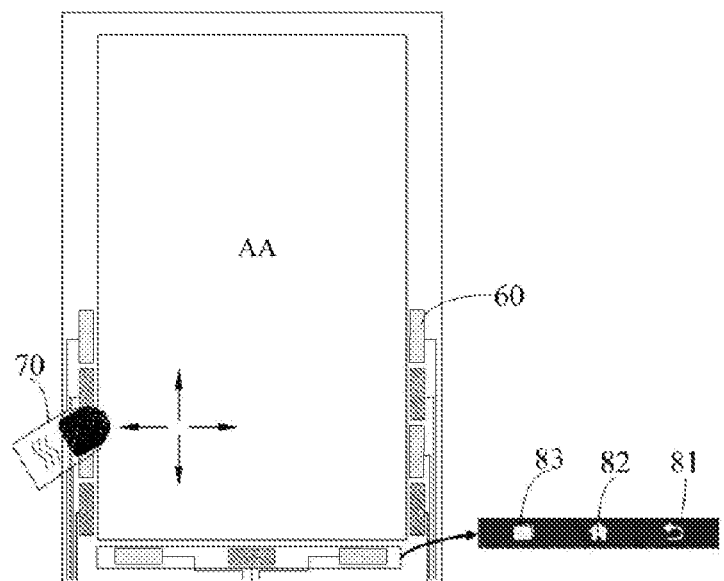
FIG. 5 is a top view of a finger touch display device provided in an embodiment of the present invention.

In the display device as shown in FIG. 5, periphery touch electrodes 60 are disposed in all of periphery areas on the left, right sides and bottom sides of the display area (AA area), and are connected to the touch chips via wires. When a finger 70 of a user (or a stylus or the like, the following embodiments being described with a finger 70 as an example) touches a periphery touch electrode 60, the touch chip can determine which periphery touch electrode is touched by the finger 70 and carry the preset functions corresponding to the periphery touch electrode, e.g., taking picture, returning to previous page (namely return key 81), returning to homepage (homepage key 82), calling out a menu (menu key 83), etc. In general, the return key 81, the homepage key 82 and the menu key 83 are provided on the bottom side of the display area, as shown in FIG. 5.

At present, although there are display devices provided with return keys, homepage keys and menu keys in periphery areas in the art, these functional keys are implemented by flexible printed circuit boards (FPCs). Embodiments of the present invention utilize periphery touch electrodes to implement these functional keys, thereby omitting flexible printed circuit boards and reducing costs.

In addition, for example, the embodiments of the present invention may utilize periphery touch electrodes to implement set functions such as zooming page, turning page to left, right, up or down, which may be implemented by determining movement direction of a finger on the display device and implementing instructions corresponding to the movement direction with the help of the touch chip.

For example, the touch chip can determine the movement direction of the finger on the display device by detecting at least two touch positions of the finger on the display device. By taking the implementation of the function of turning page right as an example, it is possible to configure the touch chip as follows: when it is detected that a finger 70 touches the periphery touch electrode on the left side of display area and the at least two touch positions of the finger on the periphery touch electrode move from left then to right, this detection indicates that touch positions of the finger 70 on the periphery touch electrode change from left to right, and pages in the display area move from left to right accordingly.

It is to be noted that the touch chip may determine the movement direction of the finger 70 on the display device according to the at least two touch positions of the finger 70 on one or more of periphery touch electrodes. When display area touch electrodes are provided in the display area of a display device and the periphery area of the display device has small width, in order to reduce the probability that touch on a periphery touch electrode is not detected, the touch chip may also determine the movement direction of finger 70 on the display device according to at least two touch positions of the finger 70 on the at least one periphery touch electrode and the at least one display area touch electrode. Therefore, the above-mentioned at least two touch positions may all or partially correspond to the positions of periphery touch electrodes.

The touch chip may determine the movement direction of the finger according to the variation of touch positions of the finger, or may determine the movement direction of the finger according to the variation of touch area between the finger and the periphery touch electrodes.

Figure 6:
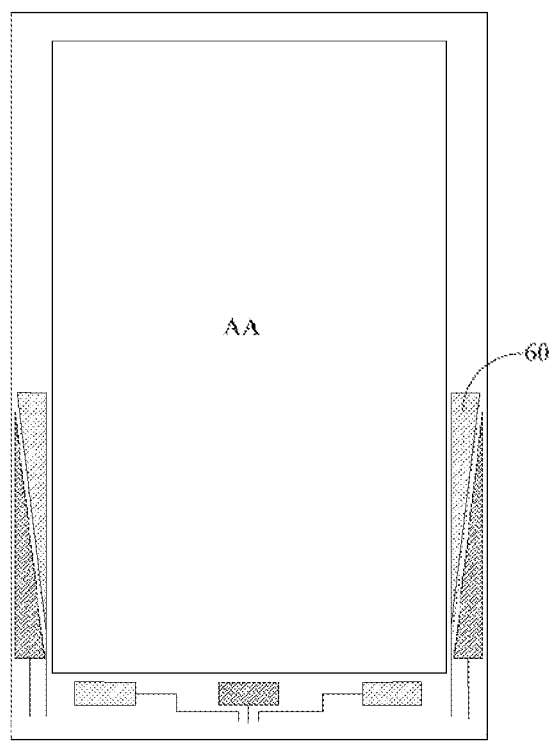
FIG. 6 is a top view of a display device provided in an embodiment of the present invention.

For example, as shown in FIG. 6, each periphery touch electrode 60 is designed in a triangle shape and every two triangular periphery touch electrodes 60 are grouped as a set. When a finger moves on a periphery touch electrode 60, the touch area between the finger and the periphery touch electrode 60 changes. The touch chip can determine variation of touch signals according to the variation of touch area and in turn derive the movement direction of the finger.

FIGS. 5 and 6 only illustrate an example in which periphery touch electrodes are located in the left periphery area, the right periphery area and the bottom periphery area of the display area AA. However, embodiments of the present invention are not limited thereto. Furthermore, the touch chip may be configured in accordance with any one of the above-mentioned embodiments, that is, the touch chip may be configured to implement the preset functions corresponding to the periphery touch electrode according to the touched periphery touch electrode; and/or the touch chip may be configured to determine the movement direction of touch on the display device according to at least two touch positions on the display device, and the above-mentioned at least two touch positions all or partially correspond to positions of periphery touch electrodes; and/or the touch chip may be configured to determine the movement direction of touch on the display device according to the variation of touch area on the periphery touch electrode.

Embodiments of the present invention are not limited to the shape of periphery touch electrodes. For instance, the periphery touch electrodes may be of polygon shape such as rectangle and triangle as long as the shape enables the touch chip to implement the preset touch functions according to the finger's touch position or movement direction.

Touch keys corresponding to periphery touch electrodes may be disposed on the protection substrate at positions corresponding to the periphery touch electrode. In at least one embodiment, the manufacturing material for the touch keys may include noctilucent materials, and therefore, under dark conditions, a user can still distinguish touch keys clearly, thereby obtaining better touch experience.

What are described above is related to the illustrative embodiments of the disclosure only and not limitative to the scope of the disclosure; the scopes of the disclosure are defined by the accompanying claims.

The present application claims priority of China Patent application No. 201510032784.0 filed on Jan. 22, 2015, the content of which is incorporated in its entirety as part of the present application by reference herein.

The invention claimed is:

1. A display device, comprising an opposed substrate and an array substrate and a liquid crystal layer therebetween, wherein the display device is divided into a display area and a periphery area, at least one layer of periphery touch electrode is provided in the periphery area;
   the opposed substrate comprises a substrate and a color filter layer located on a side of the substrate that is facing the array substrate, and the array substrate comprises a plurality of thin film transistors arranged in an array;
   the at least one layer of periphery touch electrode is disposed on the array substrate, and the at least one layer of periphery touch electrode is disposed on a side of the liquid crystal layer, which side is near the array substrate,
   wherein a plurality of layers of conductive structure are provided in the display area;
   the at least one layer of periphery touch electrode is disposed in a same layer and made of a same material as at least one layer of the plurality of layers of conductive structure, and the at least one layer of periphery touch electrode is insulated from the at least one layer of the plurality of layers of conductive structure.

2. The display device of claim 1, wherein
the at least one layer of the plurality of layers of conductive structure comprises at least one layer of display area touch electrode.

3. The display device of claim 1, wherein each of the plurality of thin film transistors comprises a gate electrode, a source electrode and a drain electrode;
the array substrate further comprises a common electrode and a pixel electrode electrically which is connected with the drain electrode, and liquid crystal molecules in the liquid crystal layer are configured to deflect under control of an electric field between the pixel electrode and the common electrode;
the plurality of layers of conductive structure comprise a layer where the gate electrode is located, a layer where the source electrode is located, a layer where the pixel electrode is located and a layer where the common electrode is located.

4. The display device of claim 3, wherein the at least one layer of periphery touch electrode comprises two layers of periphery touch electrode, the two layers of periphery touch electrode forms capacitors for touch detection.

5. The display device of claim 4, wherein the two layers of periphery touch electrode are respectively in a same layer and made of a same material as any two selected form the gate electrode, the source electrode, the pixel electrode and the common electrode.

6. The display device of claim 1, wherein the periphery area is further provided with a periphery black matrix, and the periphery black matrix is located on the opposed substrate or the array substrate.

7. The display device of claim 1, further comprising a touch chip electrically connected with the periphery touch electrodes,
wherein the touch chip is configured, according to a touched periphery touch electrode in the at least one layer of periphery touch electrode, to implement a set function corresponding to the periphery touch electrode;
the touch chip is configured to determine a movement direction of touch on the display device according to at least two touch positions on the display device, the at least two touch positions all or partially correspond to positions of the periphery touch electrode; and
the touch chip is further configured to determine a movement direction of touch on the display device according to a variation of touch area on the periphery touch electrode.

8. The display device of claim 1, wherein the at least one layer of periphery touch electrode comprises a plurality of triangular periphery touch electrodes in a same layer;
each of the triangular periphery touch electrodes is configured to determine a movement direction of touch on the display device according to a variation of touch area on the triangular periphery touch electrode.

9. The display device of claim 8, wherein every two triangular periphery touch electrodes of the plurality of triangular periphery touch electrodes are grouped as a set.

10. A display device, comprising an opposed substrate and an array substrate and a liquid crystal layer therebetween,
wherein the display device is divided into a display area and a periphery area outside the display area, the opposed substrate comprises a first base substrate and a color filter layer located on a side of the first base substrate that is facing the liquid crystal layer, and the array substrate comprises a second base substrate and a plurality of thin film transistors arranged in an array on the second base substrate;
the display device further comprises at least one layer of periphery touch electrode in the periphery area, and the color filter layer and the liquid crystal layer are disposed at different sides of the at least one layer of periphery touch electrode.

11. The display device of claim 10, wherein the at least one layer of periphery touch electrode comprises a first layer of periphery touch electrode, and the display device further comprises a second layer of periphery touch electrode in the periphery area and on a side of the second base substrate that is facing the liquid crystal layer;
the first layer of periphery touch electrode and the second layer of periphery touch electrode forms capacitors for touch detection.

12. The display device of claim 11, wherein the opposed substrate further comprises a common electrode in the display area;
the first layer of periphery touch electrode is in a same layer and made of a same material as the common electrode, and the second layer of periphery touch electrode is insulated from the common electrode.

13. The display device of claim 10, wherein the at least one layer of periphery touch electrode comprises a plurality of triangular periphery touch electrodes in a same layer;
each of the triangular periphery touch electrodes is configured to determine a movement direction of touch on the display device according to a variation of touch area on the triangular periphery touch electrode.

14. The display device of claim 13, wherein every two triangular periphery touch electrodes of the plurality of triangular periphery touch electrodes are grouped as a set.

* * * * *